United States Patent [19]
Kondoh et al.

[11] Patent Number: 5,594,369
[45] Date of Patent: Jan. 14, 1997

[54] OPEN-DRAIN FET OUTPUT CIRCUIT

[75] Inventors: Harufusa Kondoh; Katsushi Asahina, both of Hyogo, Japan

[73] Assignee: Mitsubishi Denki Kabushiki Kaisha, Tokyo, Japan

[21] Appl. No.: 449,146

[22] Filed: May 24, 1995

[30] Foreign Application Priority Data

May 24, 1994 [JP] Japan ..................................... 6-109953

[51] Int. Cl.$^6$ .............................................. H03K 19/0175
[52] U.S. Cl. .................. 326/83; 326/86; 326/121
[58] Field of Search ................................. 326/83, 86, 121

[56] References Cited

U.S. PATENT DOCUMENTS 5,023,488  6/1991  Gunning.
5,043,604  8/1991  Komaki ..................................... 326/83
5,122,691  6/1992  Balakrishnan ............................ 326/86
5,408,146  4/1995  Nguyen .................................... 326/86
5,414,375  5/1995  Tsuboi ..................................... 326/30

Primary Examiner—Edward P. Westin
Assistant Examiner—Andrew Sanders
Attorney, Agent, or Firm—Lowe, Price, LeBlanc & Becker

[57] ABSTRACT

An input signal is inverted by an inverter in the first stage and an n-channel MOS transistor on the pull up side in a driver is driven, while an output signal of the inverter in the first stage is inverted by an inverter in the next stage and an n-channel MOS transistor on the pull down side is driven. A driving signal is output from a connection point between the n-channel MOS transistor on the pull up side and the n-channel MOS transistor on the pull down side, and an output transistor is driven by the driving signal. Since a gate voltage of the output transistor increases only by a value of a power supply voltage Vdd minus threshold voltage $V_T$, a rise time and a fall time of a gate potential can be reduced, resulting in improvement in the duty cycle.

7 Claims, 10 Drawing Sheets

$td_{1'} \doteq td_{2'} < td_2$ (a) N1

(b) INPUT (c) OUTPUT $td_1 \doteq td_2$ (a) INPUT SIGNAL (b) NODE N3

(c) NODE N4

(d) NODE N5

(e) NODE N6

(f) OUTPUT SIGNAL

OPEN-DRAIN FET OUTPUT CIRCUIT

BACKGROUND OF THE INVENTION

1. Field of the Invention

The present invention relates to an output circuit of a semiconductor device, and more particularly, to an open drain type output circuit in which a drain of a field effect transistor (FET) or the like is connected to an output terminal.

2. Description of the Background Art

FIG. 11 is a circuit diagram showing an example of an open drain type MOS driver circuit disclosed in the U.S. Pat. No. 5,023,488. In FIG. 11, an input signal is applied to a gate of a p-channel MOS transistor 1 as well as a gate of an n-channel MOS transistor 2. A voltage $V_{TT}$ is applied to a source of p-channel MOS transistor 1, and a drain thereof is connected to a drain of n-channel MOS transistor 2 and a node N1. A source of n-channel MOS transistor 2 is grounded, and node N1 is connected to an input of an inverter 3, a gate of an output transistor 7, and a source of an n-channel MOS transistor 5. An output of inverter 3 is applied to an inverter 4, and an output thereof is connected to a gate of an n-channel MOS transistor 6. A source of n-channel MOS transistor 6 is connected to a drain of n-channel MOS transistor 5, and the input signal is applied to a gate of n-channel MOS transistor 5. A drain of output transistor 7 as well as a drain of n-channel MOS transistor 6 are connected to an output pad 8. A load 10 is connected to output pad 8 through a cable 9.

The n-channel MOS transistor 2 shown in FIG. 11 is constituted by a transistor having large on resistance, i.e., small driving force in order to control so-called slew rate. This is for the purpose of reducing a noise element such as ringing caused by a parasitic inductance or capacitance which occurs when a state of output transistor 7 changes from on to off and an output voltage thereof rises from an "L" level to an "H" level.

FIG. 12 is a timing chart illustrating an operation of the driver circuit shown in FIG. 11, and FIGS. 13–15 show an operation condition of the output transistor.

The operation of the driver circuit shown in FIG. 11 will now be described with reference to FIG. 12. When an input signal rises from an "L" level to an "H" level as shown in FIG. 12(a), n-channel MOS transistor 2 is turned on, and therefore, potential of node N1 falls gradually as shown in FIG. 12(b), and the gate of output transistor 7 is discharged by n-channel MOS transistor 2. However, since the driving force of n-channel MOS transistor 2 is small, discharging speed does not increase. In addition, although n-channel MOS transistor 5 is turned on by the input signal as shown in FIG. 12(d), n-channel MOS transistor 6 is also turned on only for 1 nsec which is required for a signal of node N1 to pass through inverters 3 and 4 as shown in FIG. 12(e). At this time, a condition of output transistor 7 is equivalent to that in which an on resistance R1 of an inverter constituted by p-channel MOS transistor 1 and n-channel MOS transistor 2 in the preceding stage of node N1 is connected between the gate of output transistor 7 and the ground, and a resistance R2 with on resistances of n-channel MOS transistors 5 and 6 connected in series is connected between the gate and the drain of output transistor 7 as shown in FIG. 13(a), and since on resistance R1 is extremely large, output transistor 7 can be represented by an equivalent circuit as shown in FIG. 13(b). Thus, output transistor 7 is in a self-biasing condition, and a node voltage of output pad 8 drops relatively slowly towards a value of a threshold voltage of output transistor 7 plus α. As described above, a voltage of node N1 reduces gradually as shown in FIG. 12(b) for about 1 nsec during which both n-channel MOS transistors 5 and 6 are turned on as shown in FIG. 2(f).

Then, if n-channel MOS transistor 2 is turned on completely, output transistor 7 is turned off completely as shown in FIG. 12(g). Thus, output transistor 7 can be prevented from being turned off abruptly, resulting in reduction in noise.

In this case, as shown in FIG. 14, the swing at node N1 has a significant difference between rise and fall, and therefore, an output signal would have a short "H" level period and a long "H" level period even if an input signal has a duty cycle of a 50% "H" level period and a 50% "L" level period. In other words, the duty cycle cannot be maintained. This occurs even if the slew rate is not controlled in node N1, and as shown in FIG. 15, since a threshold voltage $V_T$ of n-channel MOS transistor 2 is lower than Vdd/2, $t_{d1}$ becomes nearly equal to $t_{d2}$ even if a rise time and a fall time of node N1 are the same, and the imbalance of the duty cycle is not eliminated.

FIG. 16 shows another example of a conventional output circuit. In this output circuit shown in FIG. 16, control of the slew rate is carried out at the time of transition of a state of an output transistor 13 from on to off.

In FIG. 16, an input signal is inverted by an inverter 3, and input to an inverter 4 and a gate of an n-channel MOS transistor 14 through a node N3. An output of inverter 4 is applied to respective gates of a p-channel MOS transistor 11, an n-channel MOS transistor 12 and an n-channel MOS transistor 15. The slew rate is controlled in p-channel MOS transistor 11 and n-channel MOS transistor 12 as in the case of p-channel MOS transistor 1 and n-channel MOS transistor 2 of FIG. 11. A power supply voltage Vdd is applied to a source of p-channel MOS transistor 11, and a drain thereof is connected to a drain of n-channel MOS transistor 12, a node N6, and a gate of output transistor 13. A source of output transistor 13 is grounded, and a signal is extracted from a drain thereof. Respective drains of n-channel MOS transistors 14 and 15 are connected to a source of n-channel MOS transistor 12 through a node N5, and respective sources of n-channel MOS transistors 14 and 15 are grounded.

FIG. 17 is a timing chart simulating an operation of the output circuit shown in FIG. 16. The operation of the output circuit shown in FIG. 16 will now be described with reference to FIG. 17. When an input signal rises from an "L" level to an "H" level as shown in FIG. 17(a), the input signal is inverted by inverter 3 and output to node N3, and node N3 falls to an "L" level as shown in FIG. 17(b). Thus, n-channel MOS transistor 14 is turned off, the input signal is further inverted by inverter 4, and node N4 attains to an "H" level as shown in FIG. 17(c). Accordingly, although n-channel MOS transistor 15 is turned on, node N5 falls from an "H" level to an "L" level gradually as shown in FIG. 17(d) due to small driving force of n-channel MOS transistor 12. Thus, node N6 falls gradually as shown in FIG. 17(e), and the drain of output transistor 13 rises gradually as shown in FIG. 17(f). Therefore, even if an input signal has the duty cycle of 50%, an output signal has the duty cycle of about 25% for an "H" level and about 75% for an "L" level, with a non-return-to-zero (RZ) waveform of 200 MHz. As a result, as frequency of the input signal becomes higher, the duty cycle of the output signal becomes less satisfactory.

SUMMARY OF THE INVENTION

It is therefore an object of the present invention to provide an output circuit of a semiconductor device by which an output signal having approximately the same duty cycle as that of an input signal can be obtained.

In summary, a driving signal having an amplitude centered at a value of an on voltage or a threshold voltage of an open drain type output transistor is applied to an input electrode of the output transistor in response to an input signal.

Thus, according to the present invention, a rise time and a fall time of a signal output to a drain of the output transistor can be reduced to be approximately the same, and therefore, the duty cycle of the output signal can be improved to reproduce the duty cycle of the input signal accurately, resulting in higher speed operation.

In more preferred embodiment, two field effect transistors of a first conductivity type, two field effect transistors of a second conductivity type, or two field effect transistors of first and second conductivity types, respectively, are connected in series, and a driving signal applied to an output transistor is pulled up at one of the field effect transistors and pulled down at the other field effect transistor.

In a further preferred embodiment, a diode element for dropping a power supply voltage is connected between a power supply line and a first electrode of a field effect transistor on the pull up side of two field effect transistors constituting a driver circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
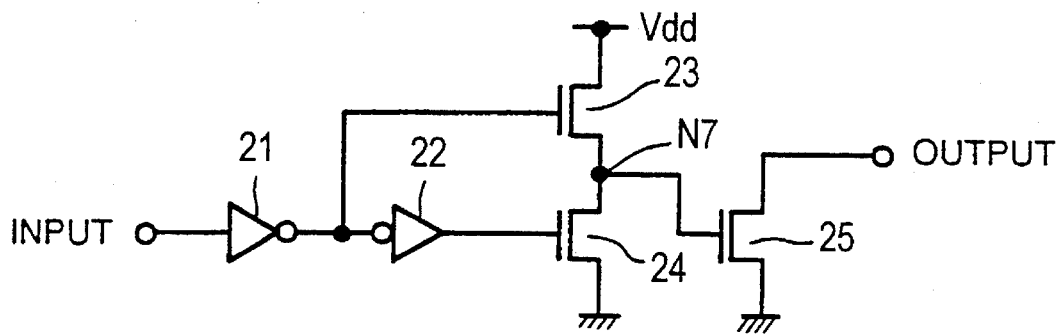
FIG. 1 is an electric circuit diagram showing one embodiment of the present invention.

FIG. 1 is a circuit diagram showing one embodiment of the present invention. In this embodiment, a driver circuit for driving an output transistor 25 is constituted by n-channel MOS transistors 23 and 24. An input signal is applied to an inverter 21 and inverted, and then, applied to a gate of n-channel MOS transistor 23 as well as an inverter 22 and further inverted. An output of inverter 22 is applied to a gate of n-channel MOS transistor 24, a power supply voltage Vdd is applied to a drain of n-channel MOS transistor 23, and a source of n-channel MOS transistor 23 is connected to a drain of n-channel MOS transistor 24 and a gate of an output transistor 25 through a node N7. A source of n-channel MOS transistor 24 and a source of output transistor 25 are grounded, and an output signal is extracted from a drain of output transistor 25. The n-channel MOS transistor 23 pulls up a gate voltage of output transistor 25, and n-channel MOS transistor 24 pulls down the gate voltage of output transistor 25.

Figure 2:
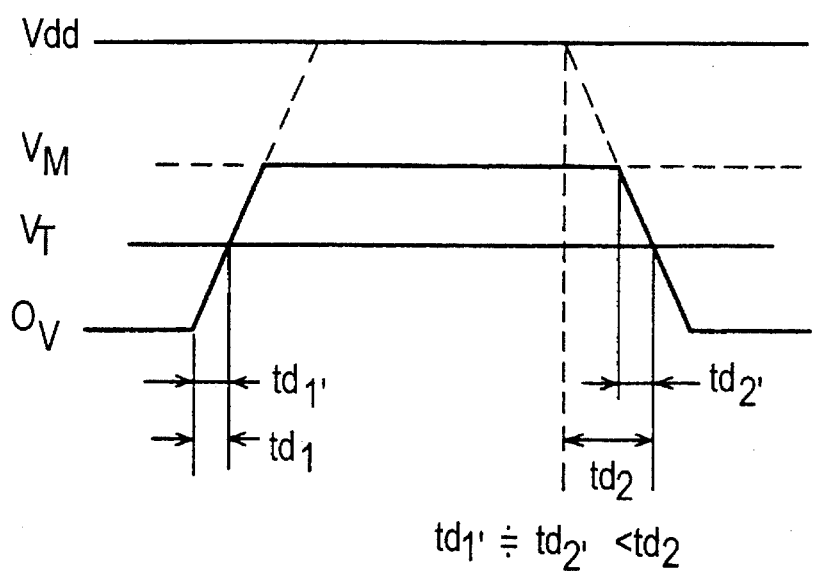
FIG. 2 is a diagram of waveforms illustrating change in potential of a node N7 of the embodiment shown in FIG. 1.

FIG. 2 is a diagram of waveforms illustrating change in potential of node N7 of the embodiment shown in FIG. 1. An operation of the output circuit shown in FIG. 1 will now be described. In the recent miniaturization process, power supply voltage Vdd of 3 V system has been dominant instead of 5 V, and a voltage of 3.3 V, for example, is used in this case.

When an input signal is at an "L" level, an output of inverter 21 attains to an "H" level and n-channel MOS transistor 23 is turned on. However, potential of node N7 rises only to a value of Vdd minus $V_T$ if a threshold voltage of output transistor 25 is represented by $V_T$. This is because of the fact that since a gate voltage of n-channel MOS transistor 23 is at most a value of Vdd, a source potential of node N7 must be lower than a gate potential of transistor 23 by a value of the threshold voltage $V_T$ of transistor 23 in order to turn on n-channel MOS transistor 23. Thus, transition of node N7 is such as shown by a solid line in FIG. 2. That is, as can be seen from FIG. 2, a rise time $t_r$ and a fall time $t_f$ in transition of potential of node N7 are shorter than those in a conventional example shown by a dotted line. In other words, with the threshold voltage of output transistor 25 represented by $V_T$, although time $t_{d1}'$ required for output transistor 25 to conduct in this embodiment is equal to time $t_{d1}$ in the conventional example, time $t_{d2}'$ required for output transistor 25 to be cut off is shorter than time $t_{d2}$ of the conventional example despite of the same change rate dV(N7)/dt of transition of node N7 as that of the conventional example. As a result, more satisfactory output duty cycle can be obtained.

In FIG. 1, if the power supply voltage Vdd is 3.3 V and the threshold voltage $V_T$ of output transistor 25 is about 0.7, an output voltage $V_O$ is equal to a value of 3.3 minus about 0.7, that is, about 2.6 V.

In addition, when an operation speed of the driver circuit is limited not by driving force of output transistor 25 but by n-channel MOS transistors 23 and 24 in the preceding stage thereof (when slew rate control or the like is provided), the driver circuit with a transition shown by the solid line in FIG. 2 can deal with smaller duty cycle than that with a transition shown by the dotted line in FIG. 2, and therefore, should be suitable for higher speed operation. This is because time required for transition from $V_M$ to Vdd shown by the dotted line in FIG. 2 is not necessary. Therefore, the present embodiment can deal with higher frequency than the conventional driver circuit.

Figure 3:
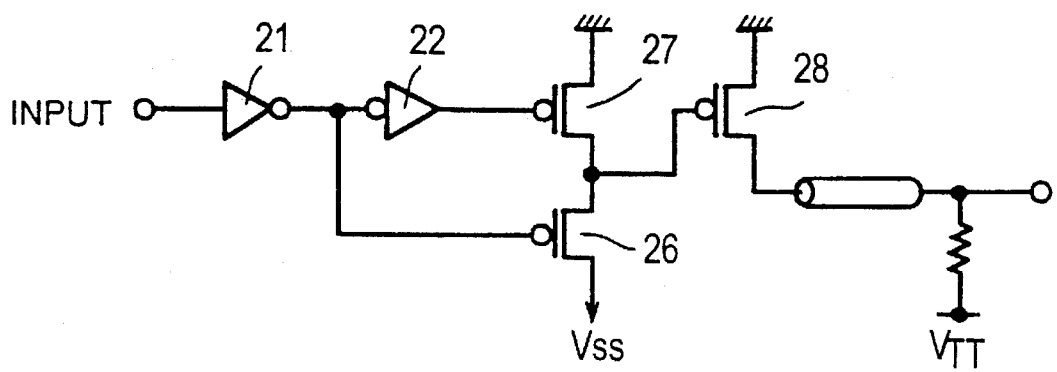
FIG. 3 is a circuit diagram showing a second embodiment of the present invention.

FIG. 3 is a circuit diagram showing a second embodiment of the present invention. In the present embodiment of FIG. 3, p-channel MOS transistors 26–28 are provided instead of n-channel MOS transistors 23–25 shown in FIG. 1 to change a polarity of a power supply, and operation thereof is similar to that in FIG. 1. Therefore, description will not be repeated.

Figure 4:
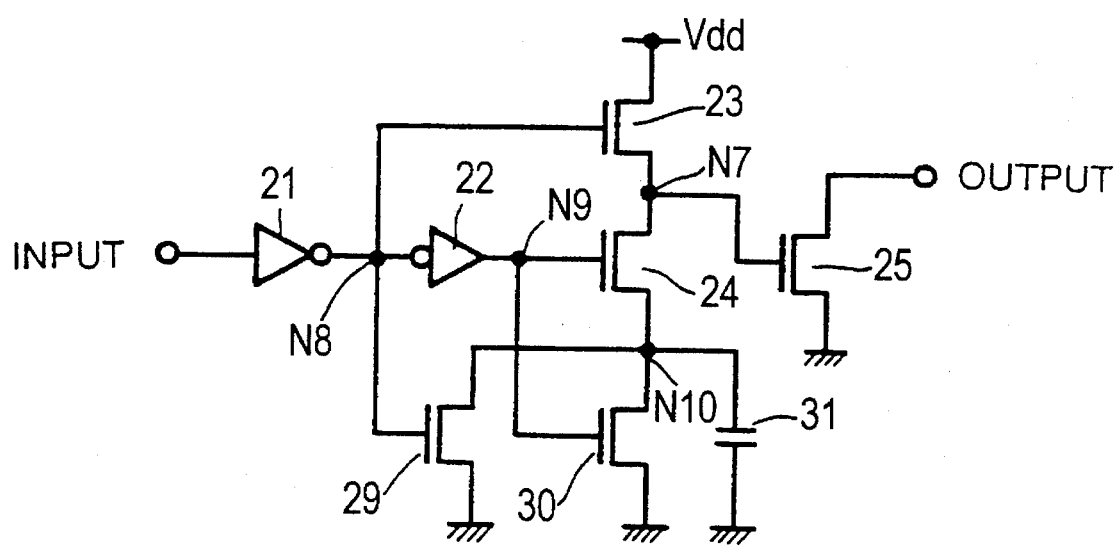
FIG. 4 is a circuit diagram showing a third embodiment of the present invention.

FIG. 4 is a circuit diagram showing a third embodiment of the present invention. In the present embodiment, slew rate control is provided in the output circuit shown in FIG. 1. That is, an output of an inverter 21 is connected to a gate of an n-channel MOS transistor 29 through a node N8, an output of an inverter 22 is connected to a gate of an n-channel MOS transistor 30, respective sources of n-channel MOS transistors 29 and 30 are grounded, and respective drains thereof are connected to a source of an n-channel MOS transistor 24. A capacitor 31 is connected between the source of n-channel MOS transistor 24 and the ground. Capacitor 31 is provided to delay on/off operation of output transistor 25 and prevent occurrence of ringing.

Figure 5:
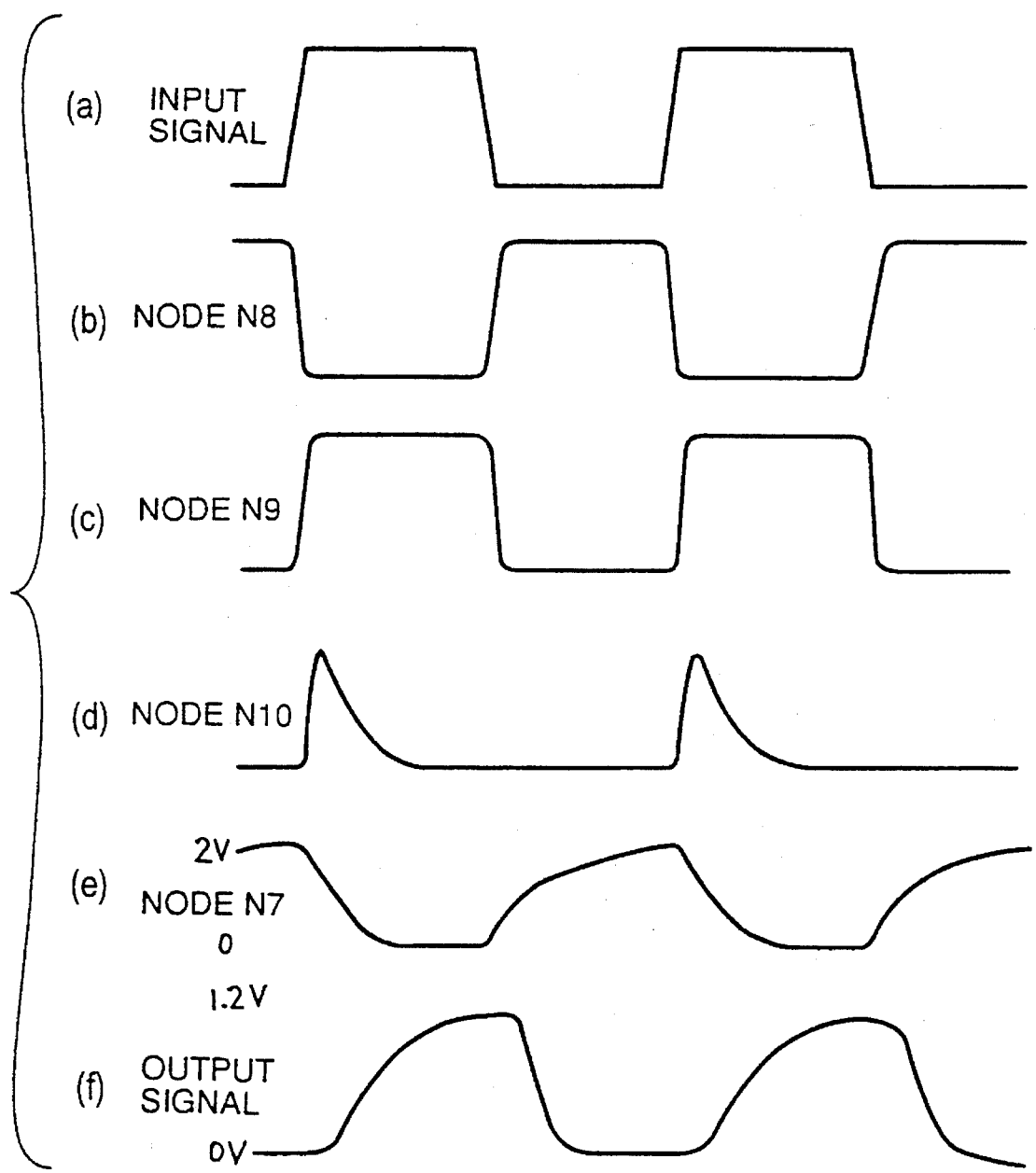
FIG. 5 is a timing chart simulating an operation of the output circuit shown in FIG. 4.

FIG. 5 is a timing chart simulating an operation of the output circuit shown in FIG. 4. Operation of the output circuit shown in FIG. 4 will now be described. When an input signal rises from an "L" level to an "H" level as shown in FIG. 5(a), node N8 falls from an "H" level to an "L" level as shown in FIG. 5(b) and n-channel MOS transistors 23 and 29 are turned off. An output of inverter 21 is further inverted by inverter 22, a node N9 attains to an "H" level as shown in FIG. 5(c), and n-channel MOS transistors 24 and 30 are turned on. At this time, since charges are stored in capacitor 31, a node N10 falls to an "L" level not abruptly but gradually as shown in FIG. 5(d). Accordingly, a node N7 falls gradually from an "H" level to an "L" level as shown in FIG. 5(e), output transistor 25 is also turned off gradually, and an output thereof rises to an "H" level gradually as shown in FIG. 5(f).

The result of simulation of FIG. 5 shows that when a non-return-to-zero (RZ) signal having a 5 msec cycle of an "H" level and an "L" level is input as an input signal, the duty cycle of an output signal can be 40% for an "H" level and 60% for an "L" level, resulting in improvement in the duty cycle.

Figure 6:
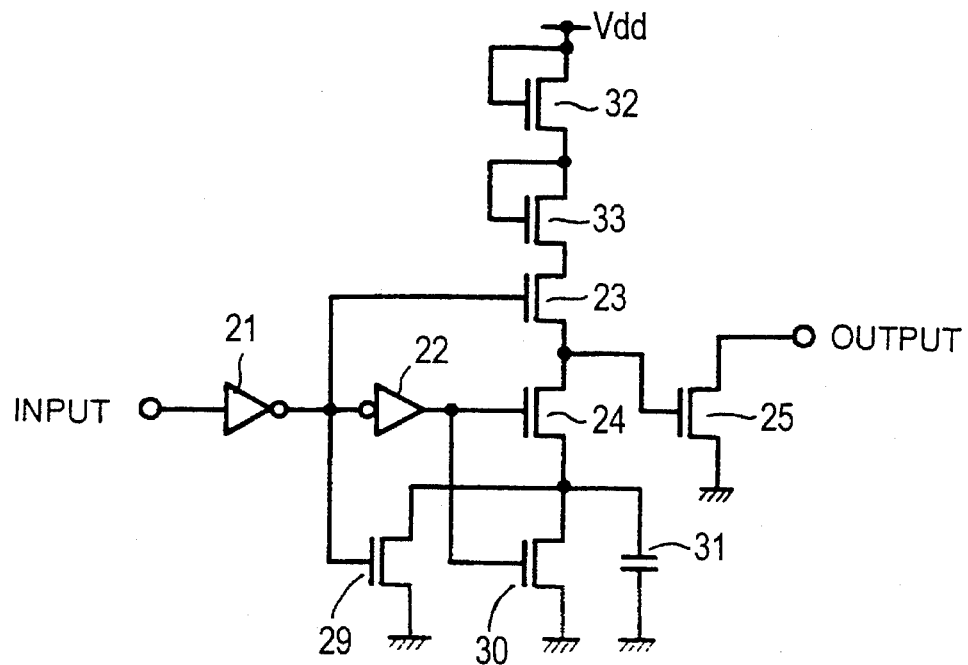
FIG. 6 is a circuit diagram showing a fourth embodiment of the present invention.

FIG. 6 is a diagram showing a fourth embodiment of the present invention.

In the present embodiment, n-channel MOS transistors 32 and 33 are diode-connected in series between a drain of an n-channel MOS transistor 23 which serves as a driver and a line of a power supply voltage Vdd, whereby a potential of the drain of n-channel MOS transistor 23 is reduced. By reducing the potential as described above, the duty cycle can be further improved, resulting in an output signal having the duty cycle of about 50%.

Figure 7:
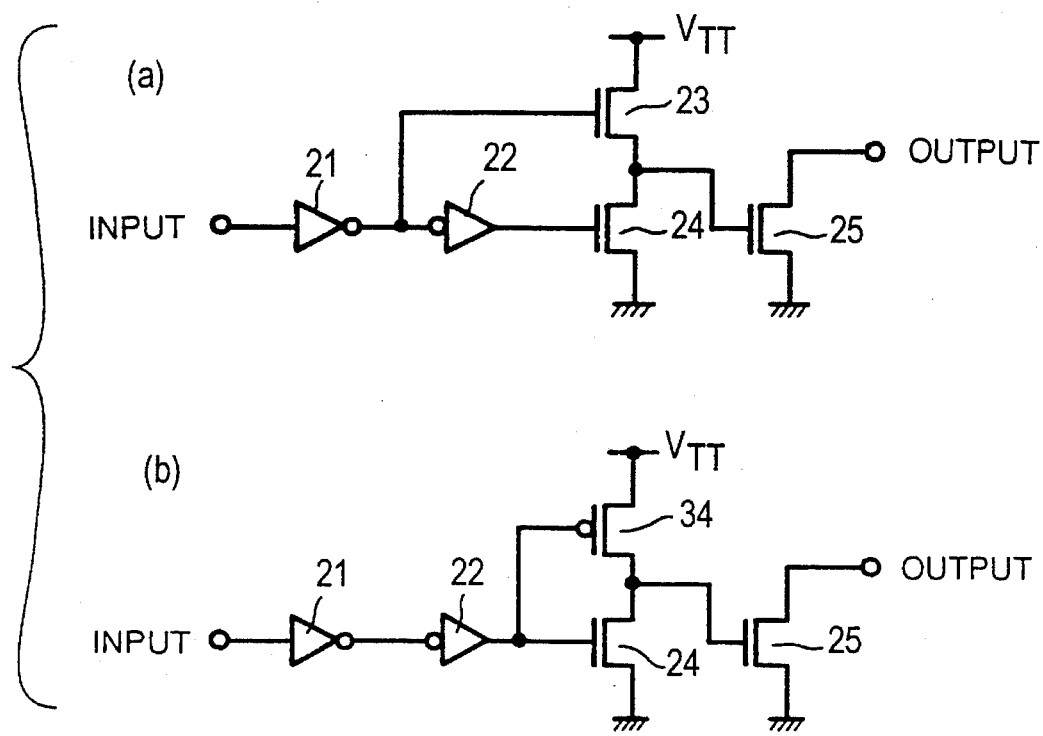
FIGS. 7(a) and (b) are circuit diagrams showing a fifth embodiment of the present invention.

FIG. 7 is a circuit diagram showing a fifth embodiment of the present invention. In the embodiment shown in FIG. 7(a), a terminal voltage $V_{TT}$ is used instead of the power supply voltage Vdd used in the embodiment shown in FIG. 1, and in the embodiment shown in FIG. 7(b), a p-channel MOS transistor 34 is provided instead of n-channel MOS transistor 23 of FIG. 7(a), and a gate thereof is connected to an output of an inverter 22.

Since terminal voltage $V_{TT}$ is 1.2 V in the GTL interface, for example, and is normally provided on a board in which an LSI is mounted, preparation of additional terminal voltage $V_{TT}$ is not needed, and terminal voltage $V_{TT}$ can be introduced easily without increase in cost. In this case as well, a higher speed driver having better duty cycle can be implemented than in the case of the driver using a power supply voltage Vdd of about 3.3 V or 5 V. For slew rate control, n-channel MOS transistors 29 and 30 can be connected to outputs of inverters 21 and 22, respectively, as in the case of FIG. 4.

FIG. 7(a) and FIG. 7(b) are different from each other only in that a transistor on the pull up side is driven by n-channel MOS transistor 23 in FIG. 7(a) and by p-channel MOS transistor 34 in FIG. 7(b). A p-channel MOS transistor is normally used as shown in FIG. 7(b) judging from an inverter. However, the maximum gate voltage of n-channel MOS transistor 23, for example, is a value of the power supply voltage Vdd, and when terminal voltage $V_{TT}$ is 1.2 V, the gate voltage minus a threshold voltage $V_{TN}$, i.e., Vdd–$V_{TN}$=3.3–0.7=2.6 V, which is higher than terminal voltage $V_{TT}$. Therefore, n-channel MOS transistor 23 can also be used without voltage drop caused by threshold voltage $V_{TN}$. Generally, in an n-channel MOS transistor, driving force about twice as large as that of a p-channel MOS transistor can be obtained, W (channel width) can be designed to be small, and reduction in stray capacitance can be expected, and therefore, n-channel MOS transistor 23 is more suitable for high speed operation.

Figure 8:
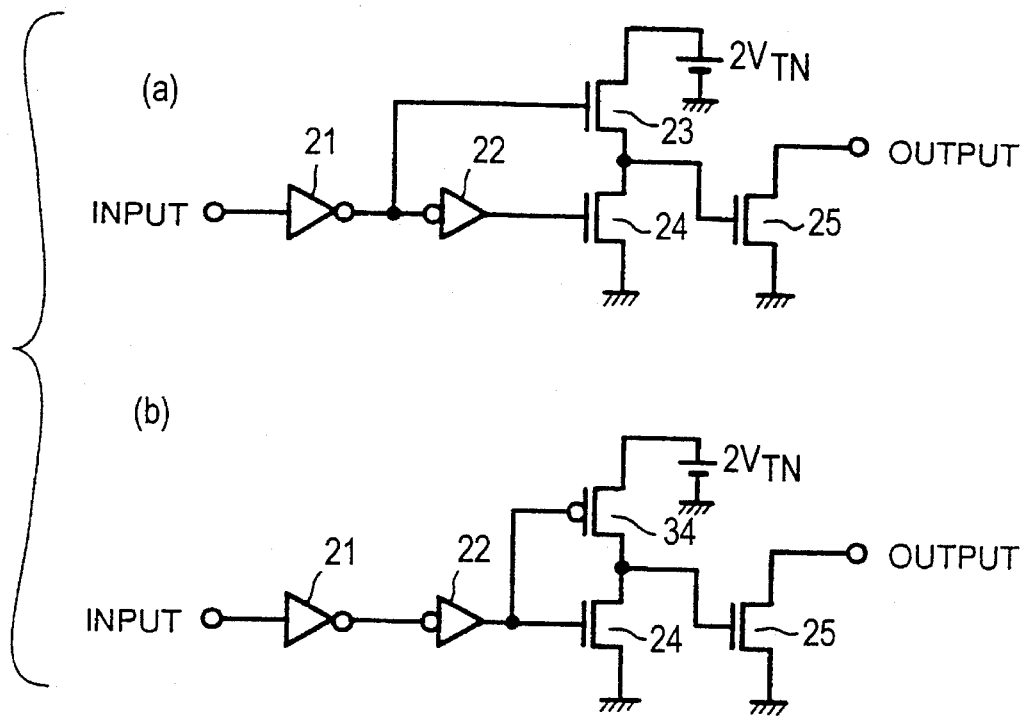
FIGS. 8(a) and (b) are circuit diagrams showing a sixth embodiment of the present invention.

FIG. 8 is a circuit diagram showing a sixth embodiment of the present invention. In the present embodiment, a gate voltage of an output transistor 25 which changes in the range from 0 V to 2 $V_{TN}$ centered at the threshold voltage $V_{TN}$ of output transistor 25 is used as a power supply voltage. In an example shown in FIG. 8(a), a transistor on the pull up side is constituted by an n-channel MOS transistor 23 as in the case of FIG. 7(a) and potential of 2 $V_{TN}$ is applied to a drain thereof. In an example shown in FIG. 8(b), a transistor on the pull up side is constituted by a p-channel MOS transistor 34 as in the case of FIG. 7(b), and potential of 2 $V_{TN}$ is applied to a source thereof. If the gate voltage has a swing centered at the threshold voltage $V_{TN}$ as described above, on and off periods of output transistor 25 can be set easily while maintaining the duty cycle of an input.

The duty cycle can be further improved if driving forces of transistors on the pull up and the pull down sides in the preceding stage of output transistor 25 are the same. When the gate voltage has a swing centered at the value far from the threshold voltage $V_{TN}$, the duty cycle cannot be maintained unless the driving force of the transistor on either pull up or pull down side is reduced on purpose, and therefore, it is not suitable for high speed operation. However, this can be solved by the embodiment shown in FIG. 8.

Figure 9:
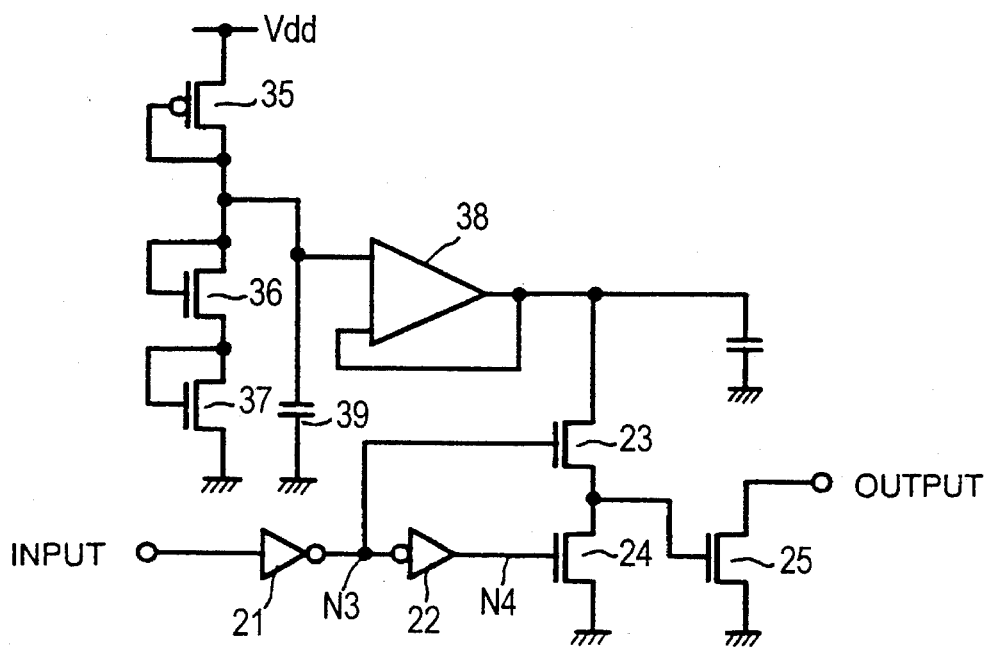
FIG. 9 is a diagram of a circuit for generating a voltage of 2 $V_{TN}$.

FIG. 9 is a diagram showing a circuit for generating a voltage of 2 $V_{TN}$ in the embodiment shown in FIG. 8. In FIG. 9, a p-channel MOS transistor 35 and n-channel MOS transistors 36 and 37 are diode-connected in series between a line of the power supply voltage Vdd and the ground. A connection point between p-channel MOS transistor 35 and n-channel MOS transistor 36 is connected to one input of an operational amplifier 38 and one end of a capacitor 39. The other end of capacitor 39 is grounded. The other input of operational amplifier 38 is connected to an output terminal. A voltage of 2 $V_{TN}$ is generated by series connection of n-channel MOS transistors 36 and 37, buffered by operational amplifier 38 and applied to a drain of n-channel MOS transistor 23. Thus, potential of 2 $V_{TN}$ corresponding to change in the threshold voltage $V_{TN}$ of output transistor 25 caused by variation in temperature or process can be generated by positioning such a circuit for generating a voltage of 2 $V_{TN}$ on the same chip as that of the driver.

Figure 10:
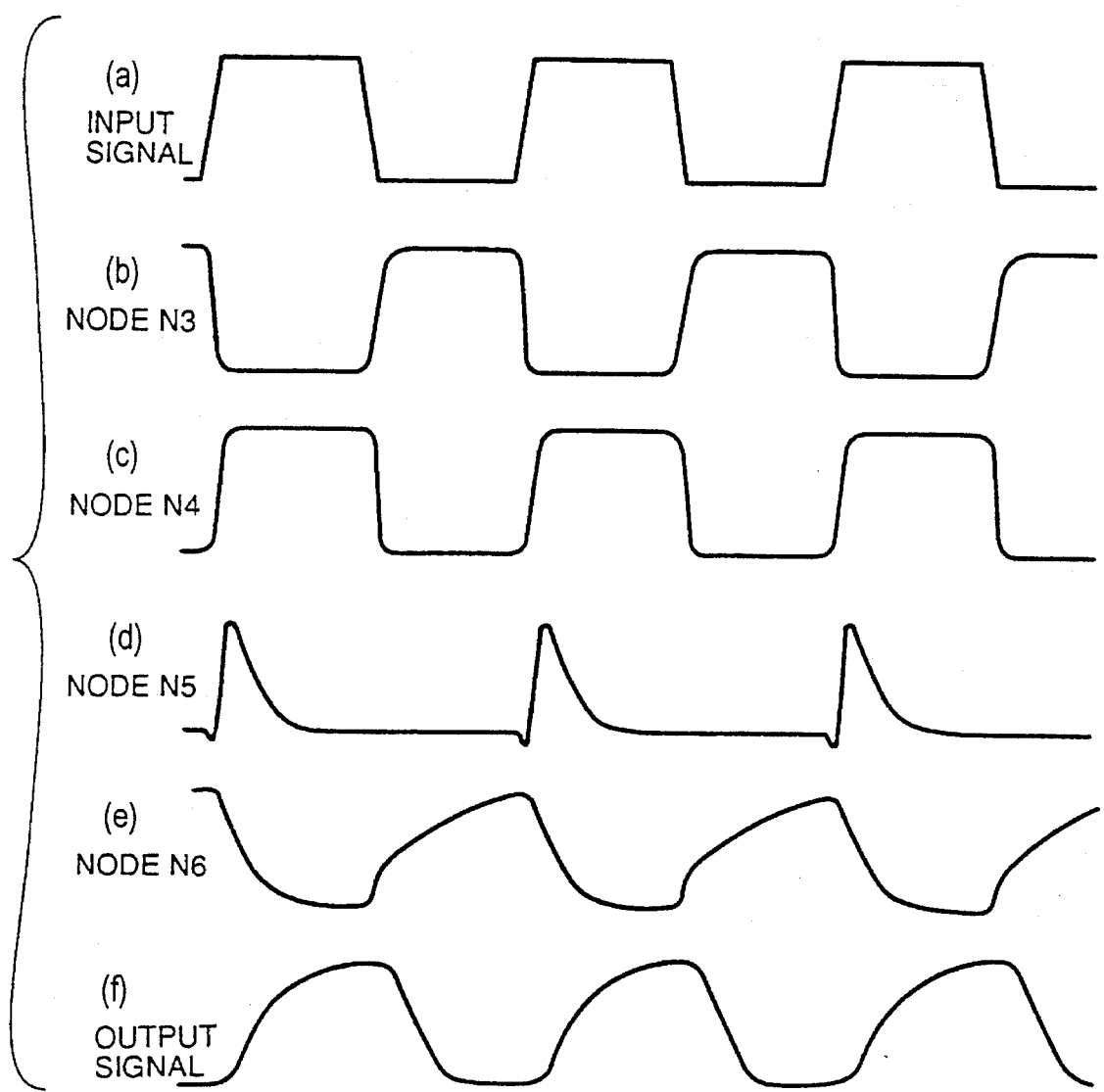
FIG. 10 is a timing chart illustrating a result of simulation of the output circuit shown in FIG. 9.
Figure 11:
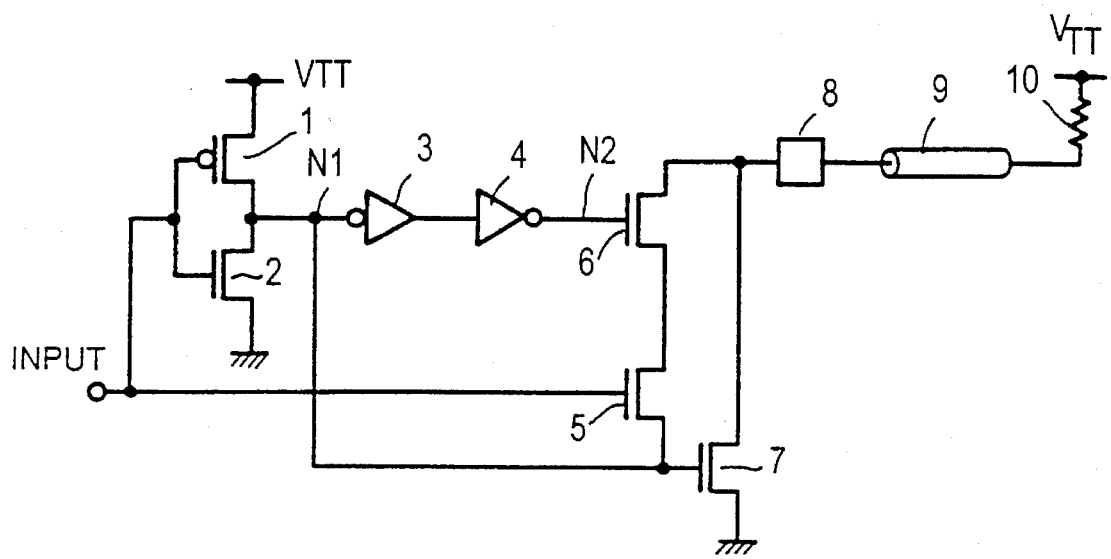
FIG. 11 is an electric circuit diagram showing one example of a conventional open drain type MOS driver circuit.
Figure 12:
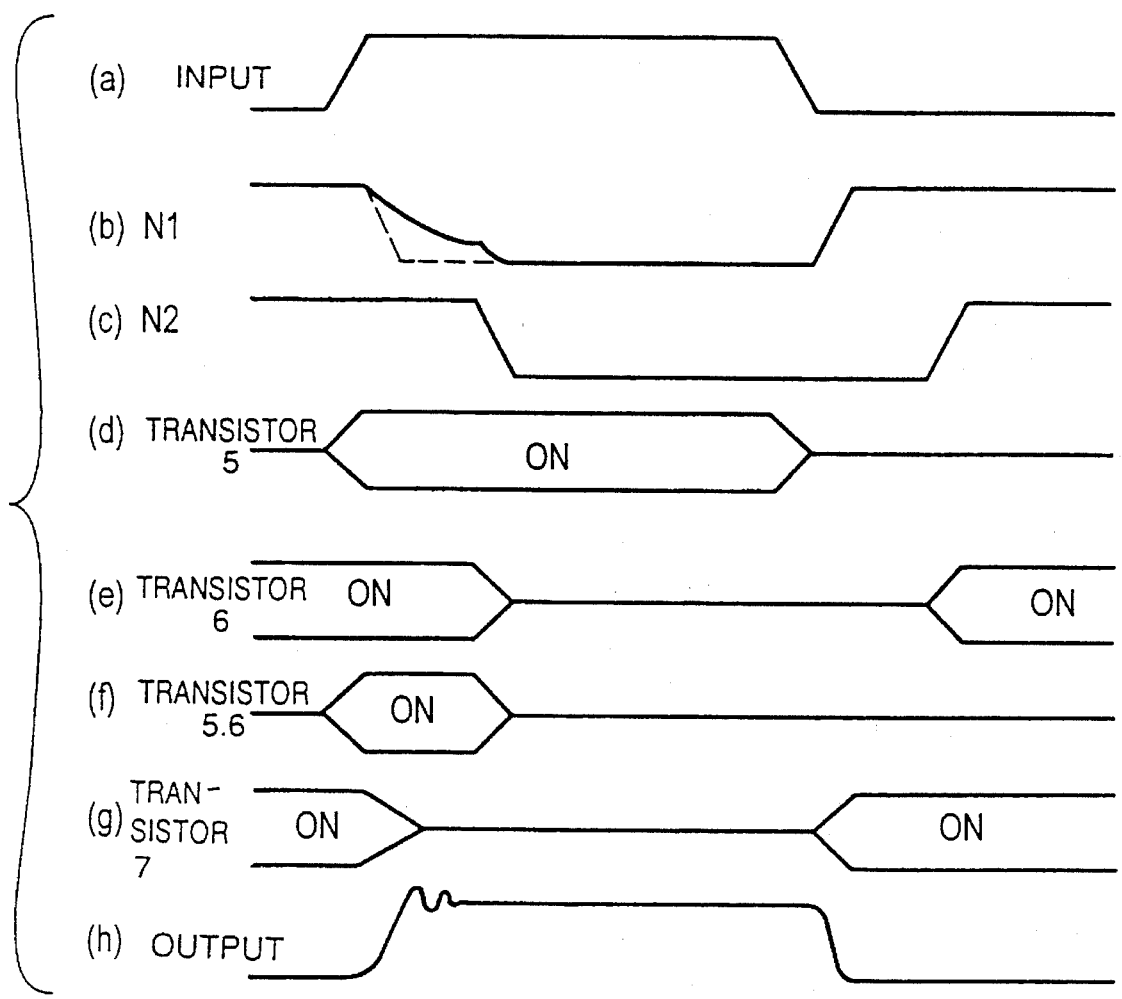
FIG. 12 is a timing chart illustrating an operation of the driver circuit shown in FIG. 11.
Figure 13:
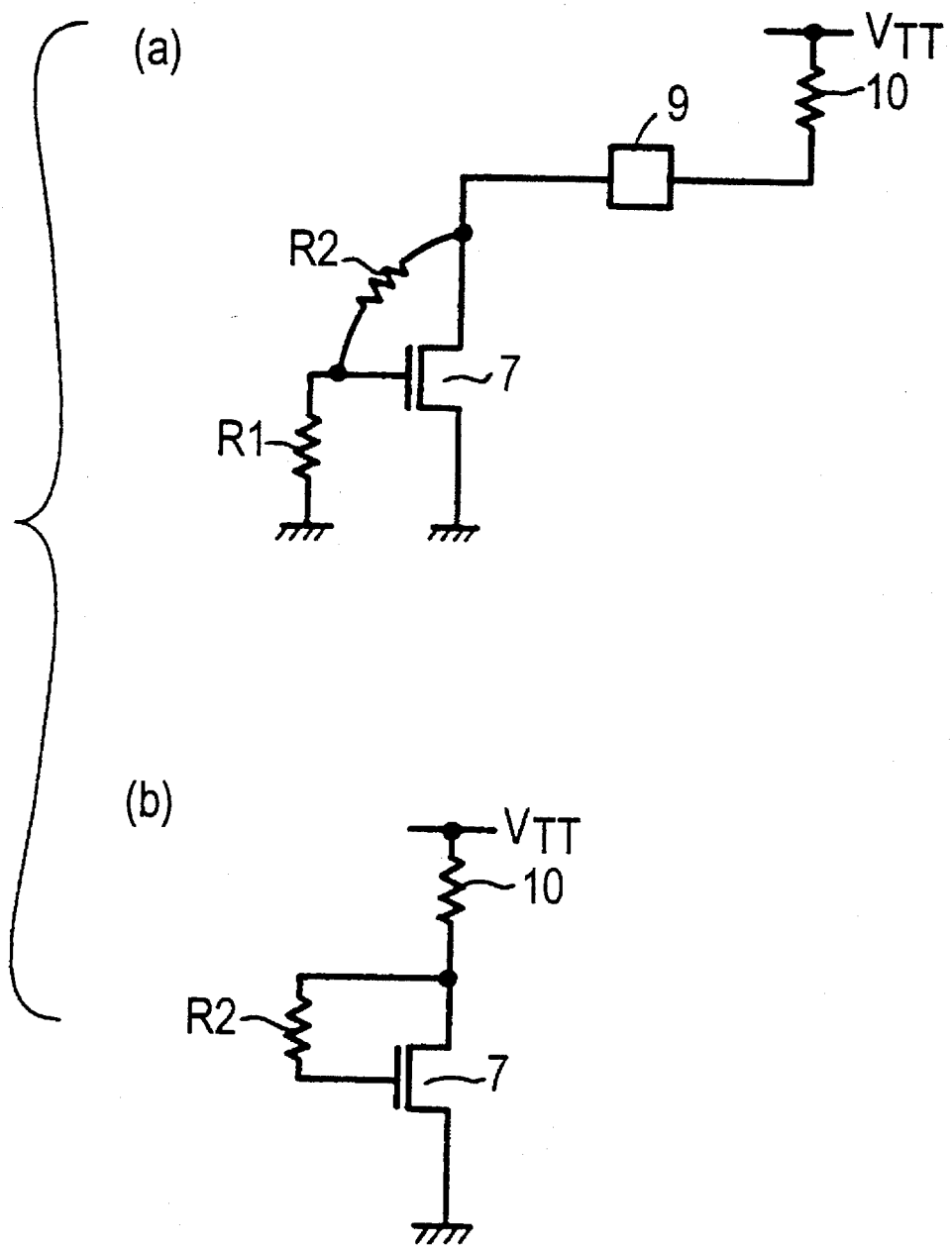
FIGS. 13a and b are diagrams illustrating an operation condition of an output transistor shown in FIG. 11.
Figure 14:
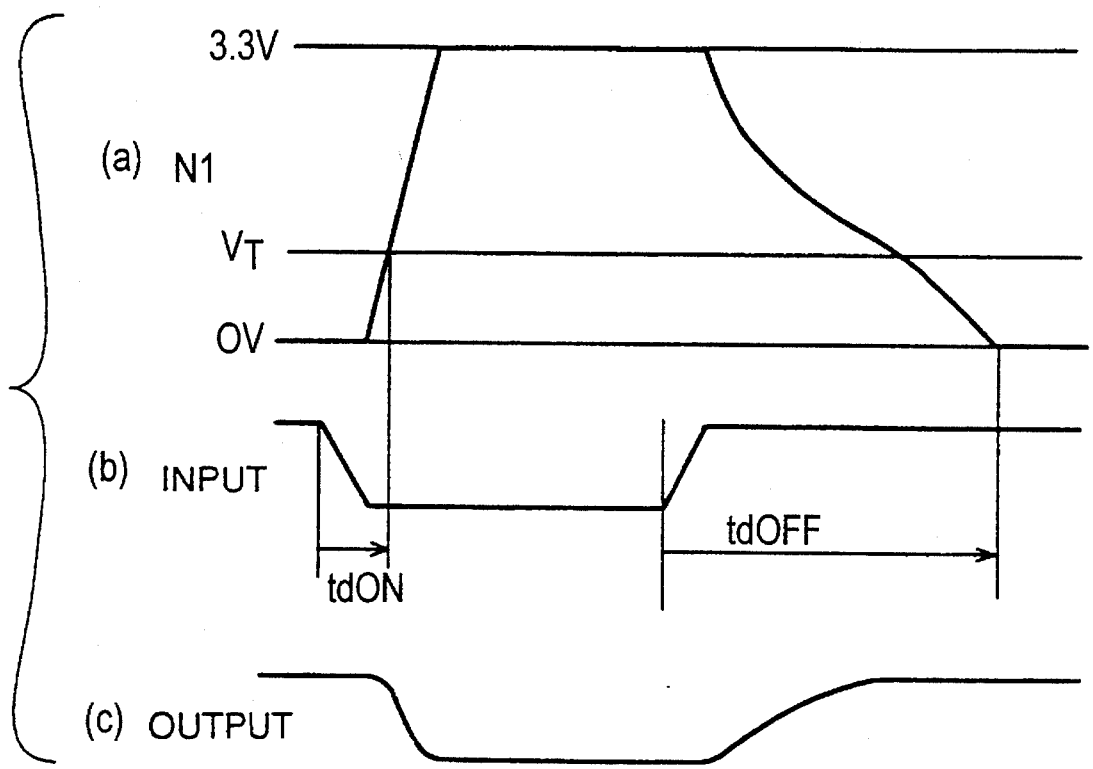
FIG. 14 is a diagram of waveforms illustrating the relationship among a node N1, an input and an output of FIG. 11.
Figure 15:
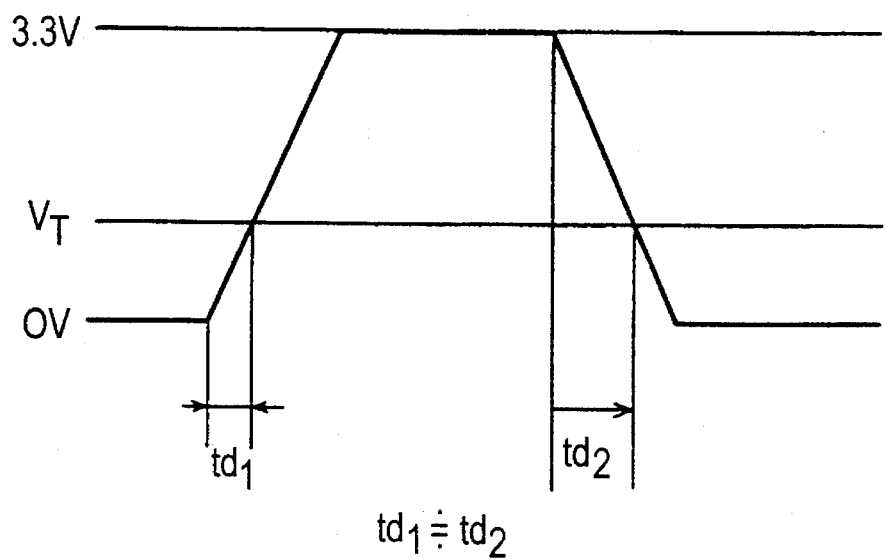
FIG. 15 is a diagram of output waveforms of the output transistor shown in FIG. 11.
Figure 16:
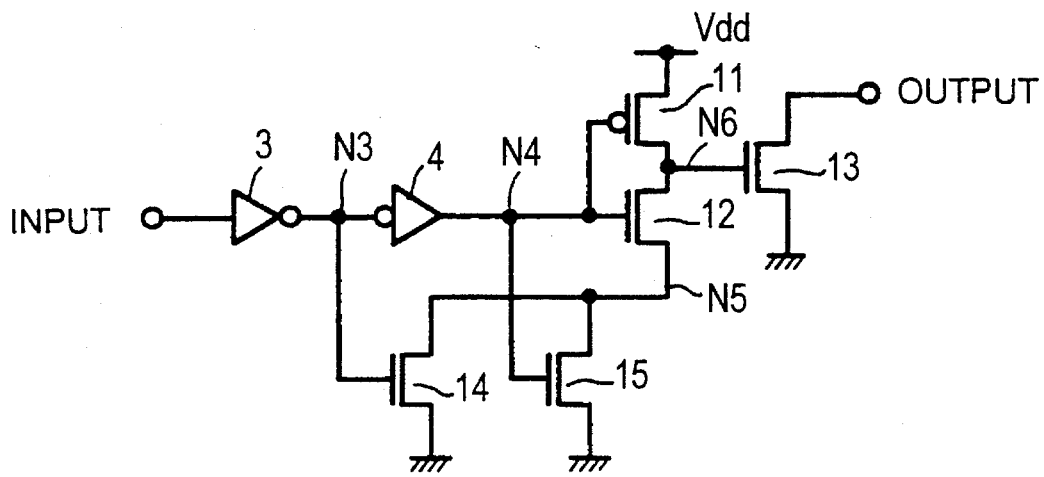
FIG. 16 is a circuit diagram showing another example of a conventional output circuit.
Figure 17:
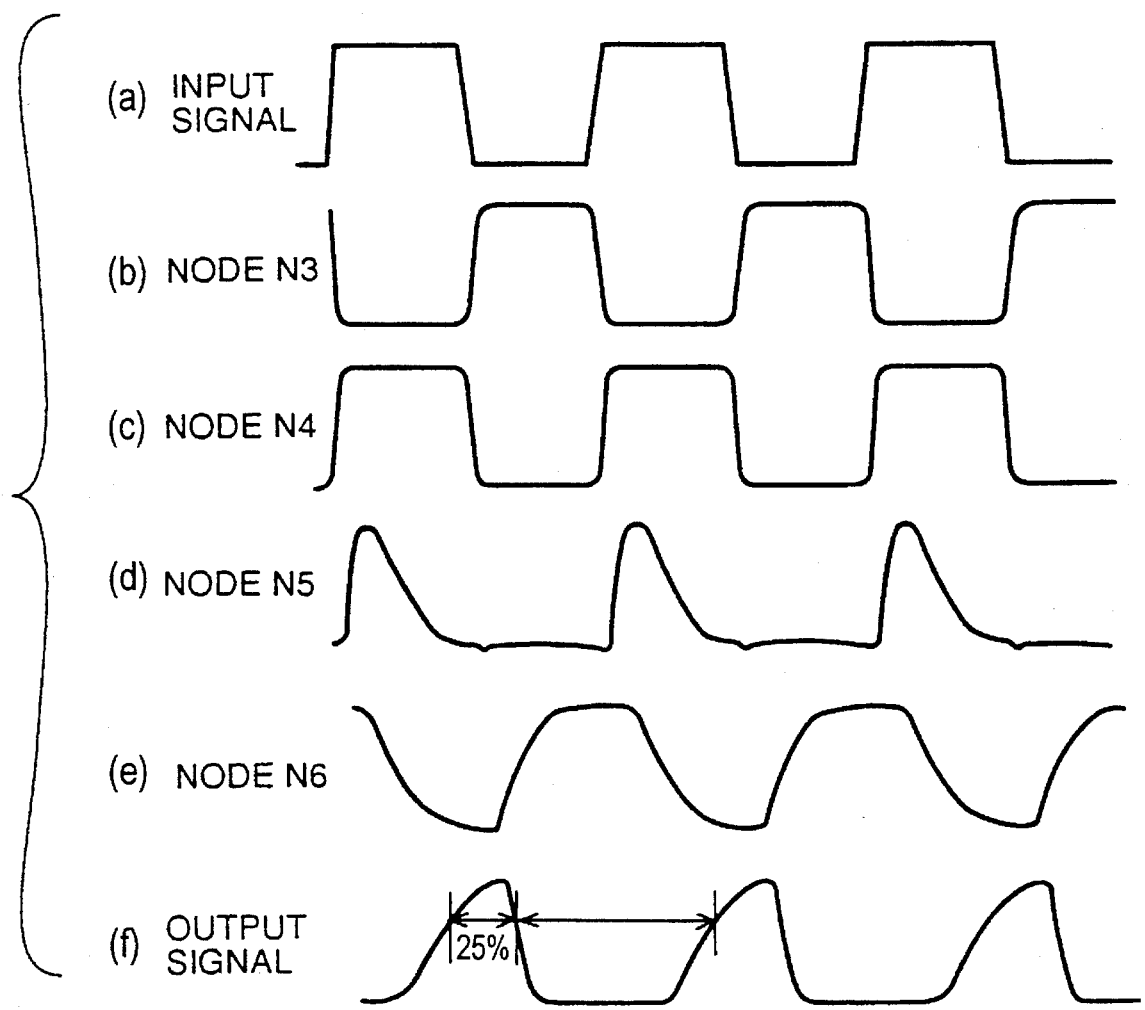
FIG. 17 is a timing chart illustrating a result of simulation of the output circuit shown in FIG. 16.

FIG. 10 is a timing chart illustrating a result of simulation of the output circuit shown in FIG. 9. The simulation of FIG. 10 shows that an output signal having 50% duty cycle can be obtained even if an RZ signal having a cycle of 2.5 msec is input as an input signal, and thus, the duty cycle can be greatly improved. In a conventional example, an acceptable output cannot be obtained even if an RZ signal having a cycle of 2.5 msec is input, and an output signal can be barely extracted by use of a signal having a cycle of 3.3 msec. Therefore, the duty cycle can be greatly improved over the conventional example. It is noted that a surge protection circuit, for example, is provided between output transistor 25 and an output terminal.

As has been described above, according to the embodiments of the present invention, an open drain type output circuit capable of reproducing the duty cycle of an input signal accurately and suitable for high speed operation can be obtained with low cost by putting limitation on a swing width of a gate voltage of an output transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output circuit of a semiconductor device, comprising:

an output field effect transistor of a first conductivity type having a drain opened for outputting a signal;

driving means for applying a driving signal having an amplitude centered at a value of an on voltage or at a threshold voltage of said output transistor to an input electrode of said output transistor in response to an input signal, wherein said driving means includes a first field effect transistor of the first conductivity type for pulling up a driving signal and a second field effect transistor of the first conductivity type for pulling down said driving signal, which have a first electrode and a second electrode, respectively, serially connected to each other and output said driving signal from a connection point therebetween, and voltage supplying means for supplying a voltage lower than a power supply voltage to a first electrode of said first field effect transistor, said voltage supplying means including means for outputting a voltage twice a threshold voltage of said output transistor.

2. The output circuit of a semiconductor device according to claim 1 wherein said voltage supplying means includes a diode element connected between a first electrode of said first field effect transistor and a power supply line for dropping a power supply voltage.

3. The output circuit of a semiconductor device according to claim 1, wherein said driving means includes a first inverter for inverting said input signal and applying the inverted input signal to an input electrode of said first field effect transistor, and a second inverter for inverting an output signal of said first inverter and applying the inverted output signal to an input electrode of said second field effect transistor.

4. The output circuit of a semiconductor device according to claim 1, wherein said driving means includes a third field effect transistor having an input electrode to which an output of said first inverter is applied, and a first electrode connected to a second electrode of said second field effect transistor, and an fourth field effect transistor having an input electrode to which an output signal of said second inverter is applied, and a first electrode connected to a second electrode of said second field effect transistor.

5. An output circuit of a semiconductor device, comprising:

an output field effect transistor of a first conductivity type having a drain opened for outputting a signal; and driving means for applying a driving signal having an amplitude centered at a value of an on voltage or at a threshold voltage of said output transistor to an input electrode of said output transistor in response to an input signal, wherein said driving means includes a first field effect transistor of a second conductivity type for pulling up said driving signal and a second field effect transistor of the first conductivity type for pulling down said driving signal, which have a first electrode and a second electrode, respectively, serially connected to each other and output said driving signal from a connection point therebetween, and voltage supplying means for supplying a voltage lower than a power supply voltage to a first electrode of said first field effect transistor, said voltage supplying means including means for outputting a voltage twice a threshold voltage of said output transistor.

6. The output circuit of a semiconductor device according to claim 5, wherein said voltage supplying means includes a diode element connected between a first electrode of said first field effect transistor and a power supply line for dropping a power supply voltage.

7. The output circuit of a semiconductor device according to claim 5, wherein said driving means includes a third inverter for inverting said input signal, and a fourth inverter for inverting an output signal of said third inverter and applying the inverted output signal to input electrodes of said fifth and sixth field effect transistors, respectively.

* * * * *